(12) United States Patent
Van Den Broeke

(10) Patent No.: US 9,374,017 B2
(45) Date of Patent: Jun. 21, 2016

(54) AC/DC CONVERTER CIRCUIT

(71) Applicant: NXP B.V., Eindhoven (NL)

(72) Inventor: Leendert Albertus Dick Van Den Broeke, Malden (NL)

(73) Assignee: NXP B.V., Eindhoven (NL)

( * ) Notice: Subject to any disclaimer, the term of this patent is extended or adjusted under 35 U.S.C. 154(b) by 187 days.

(21) Appl. No.: 13/952,305

(22) Filed: Jul. 26, 2013

(65) Prior Publication Data

US 2014/0042921 A1  Feb. 13, 2014

(30) Foreign Application Priority Data

Aug. 9, 2012 (EP) .................................. 12179781

(51) Int. Cl.

| | |
|---|---|
| *H05B 37/00* | (2006.01) |
| *H05B 39/00* | (2006.01) |
| *H05B 41/14* | (2006.01) |
| *H02M 7/217* | (2006.01) |
| *H05B 33/08* | (2006.01) |
| *H02M 1/42* | (2007.01) |

(52) U.S. Cl.
CPC ............ *H02M 7/217* (2013.01); *H02M 1/4225* (2013.01); *H05B 33/08* (2013.01); *H03K 2217/0036* (2013.01); *Y02B 70/126* (2013.01)

(58) Field of Classification Search
CPC .... H05B 41/34; H05B 33/0803; H05B 39/09; H05B 41/28; H05B 33/0809
USPC ......................................... 315/200 R; 363/89
See application file for complete search history.

(56) References Cited

U.S. PATENT DOCUMENTS

| 6,144,568 | A | 11/2000 | Franck et al. |
| 8,188,615 | B2 | 5/2012 | Du et al. |
| 8,624,572 | B2 | 1/2014 | Hosotani |
| 2006/0071237 | A1 | 4/2006 | Deboy et al. |
| 2007/0090775 | A1 | 4/2007 | Ribarich |
| 2009/0231886 | A1* | 9/2009 | Xia et al. ........................ 363/20 |
| 2010/0277953 | A1* | 11/2010 | Lu .............................. 363/21.1 |
| 2011/0068632 | A1 | 3/2011 | Du et al. |
| 2011/0109230 | A1 | 5/2011 | Simi |
| 2011/0175587 | A1 | 7/2011 | Hosotani |
| 2012/0025724 | A1* | 2/2012 | Melanson et al. ............. 315/201 |
| 2013/0169162 | A1* | 7/2013 | Simi .............................. 315/127 |
| 2013/0343095 | A1* | 12/2013 | Zhu et al. ................... 363/21.01 |

FOREIGN PATENT DOCUMENTS

| CN | 1438492 A | 8/2003 |
| CN | 102130594 A | 7/2011 |

(Continued)

OTHER PUBLICATIONS

Extended European Search Report for European Patent Appln. No. 12179781.5 (May 24, 2013).

*Primary Examiner* — Quan Tra

(57) ABSTRACT

There is disclosed an AC/DC converter circuit. The circuit comprises: an input terminal for receiving an AC supply voltage; a driver circuit adapted to supply a DC drive current or voltage to an output of the circuit based on a signal provided to a control terminal of the driver circuit; and an AC coupling network connected between the input terminal and the control terminal of the driver circuit. The AC coupling network is adapted to derive a signal from an AC supply voltage received by the input terminal and to supply the derived signal to the control terminal of the driver circuit.

10 Claims, 4 Drawing Sheets

(56) References Cited

FOREIGN PATENT DOCUMENTS

| CN | 102484417 A | 5/2012 |
|---|---|---|
| DE | 3035945 A1 | 5/1982 |
| DE | 100 40 411 A1 | 3/2002 |
| DE | 100 43 485 A1 | 3/2002 |
| EP | 0 522 425 A1 | 1/1993 |
| EP | 1335210 B1 | 11/2006 |
| JP | 7 284267 A | 10/1995 |

\* cited by examiner

AC/DC CONVERTER CIRCUIT

CROSS-REFERENCE TO RELATED APPLICATIONS

This application claims the priority under 35 U.S.C. §119 of European patent application no. 12179781.5, filed on Aug. 9, 2012, the contents of which are incorporated by reference herein.

This invention relates to the field of converter circuits, and more particularly to an AC/DC converter circuit for driving solid state lighting devices and the like.

It is known to employ AC/DC converter circuits in order to drive and control Solid State Lighting (SSL) devices, such as LEDs. With high volume production of SSL devices, there is a desire to reduce the cost of such circuits.

Conventional AC/DC converter circuits employ simple Integrated Circuit (ICs) in combination with external components. To limit the associated cost of the components, it is preferable to minimize headroom in the thermal design of the circuit and the SSL device, and this may require accurate regulation of the drive current supplied to the SSL device.

Also, for the purpose of energy conservation, good performance of the circuit in terms of efficiency and Power Factor (PF) may be required.

ICs containing an advanced algorithm to achieve a good PF and accurate drive current are available, but these are also expensive. Some existing low-cost driver solutions are known which address the drive current accuracy requirement, but these do not achieve an adequate PF.

A good PF is becoming more and more important, and places a strict requirement on driver solutions. For example, in the United States of Americas, the PF must be at least 0.7 for residential use and even >0.9 for commercial use.

Typical AC/DC converter circuits for driving a SSL device comprise a Buck, tapped-Buck, Buck-Boost or Flyback converter that, in every switching cycle, ramps up the current in an inductor to an accurate pre-defined value and then releases the magnetic energy into the SSL load. Depending on the converter working in Boundary Conduction Mode (BCM) or Discontinuous Conduction Mode (DCM), the next cycle is started right after the energy in the inductor has vanished to zero (in BCM) or only after receiving a control trigger from a separate timer, running on a defined switching frequency (in DCM).

The most simple and low-cost converter with a good performance in terms of drive current accuracy or regulation (assessable in terms of the insensitivity of the drive current to the magnitude of: the AC input voltage (e.g. a mains input voltage); the load voltage; inductor value; and switching frequency Fsw) is the Buck converter operating in BCM. However, other circuits may be configured as Buck-Boost or Flyback driver working in BCM In order to get a high PF, the switching frequency Fsw and/or the convertor input current Ipk may be modulated with the phase of the input voltage (mains frequency being typically 50 or 60 Hz for example). However, known methods to modulate the converter input current and/or the switching frequency in this way are dependent on the magnitude of the input voltage, and result in a poor regulation of the drive current. This problem of poor regulation of the drive current (also referred to as line regulation) has resulted in more complicated, and hence more expensive, circuits being implemented.

According to an aspect of the invention there is provided an AC/DC converter circuit for driving a solid state lighting device according to independent claim 1.

Proposed is an AC/DC converter circuit comprising an AC coupling network that derives a signal from an AC input voltage and supplies the derived signal to the control terminal of a driver circuit. Control of the driver circuit may therefore be modulated in phase with the AC input voltage.

Embodiments may thus modulate the input current waveform of a switching AC/DC converter using an AC supply voltage whilst preserving good accuracy (i.e. good regulation) of the output DC drive current. Thus, the PF of an AC/DC converter circuit according to an embodiment may be improved whilst maintaining regulation of the output current.

Also, embodiments may modulate an input current, switching frequency or other control parameter, without needing a waveform generator that is phase-locked to the mains phase, or without requiring complicated algorithms (like a system explicitly sensing the input voltage magnitude or a calculation and feedback loop). Existing SSL driver ICs may therefore be employed in conjunction with just a few external components in order to create embodiments of the invention.

The AC coupling network may simply consist of a capacitor arranged in series with signal to be coupled (e.g. an input AC supply voltage). In other embodiments, the AC coupling network may further comprise one or more resistors that serve to scale the coupled signal.

Examples of the invention will now be described in detail with reference to the accompanying drawings, in which.

The terms, chip, integrated circuit (IC), monolithic device, semiconductor device, and microelectronic device, are often used interchangeably in this field. The present invention is applicable to all the above as they are generally understood in the field.

Figure 1:
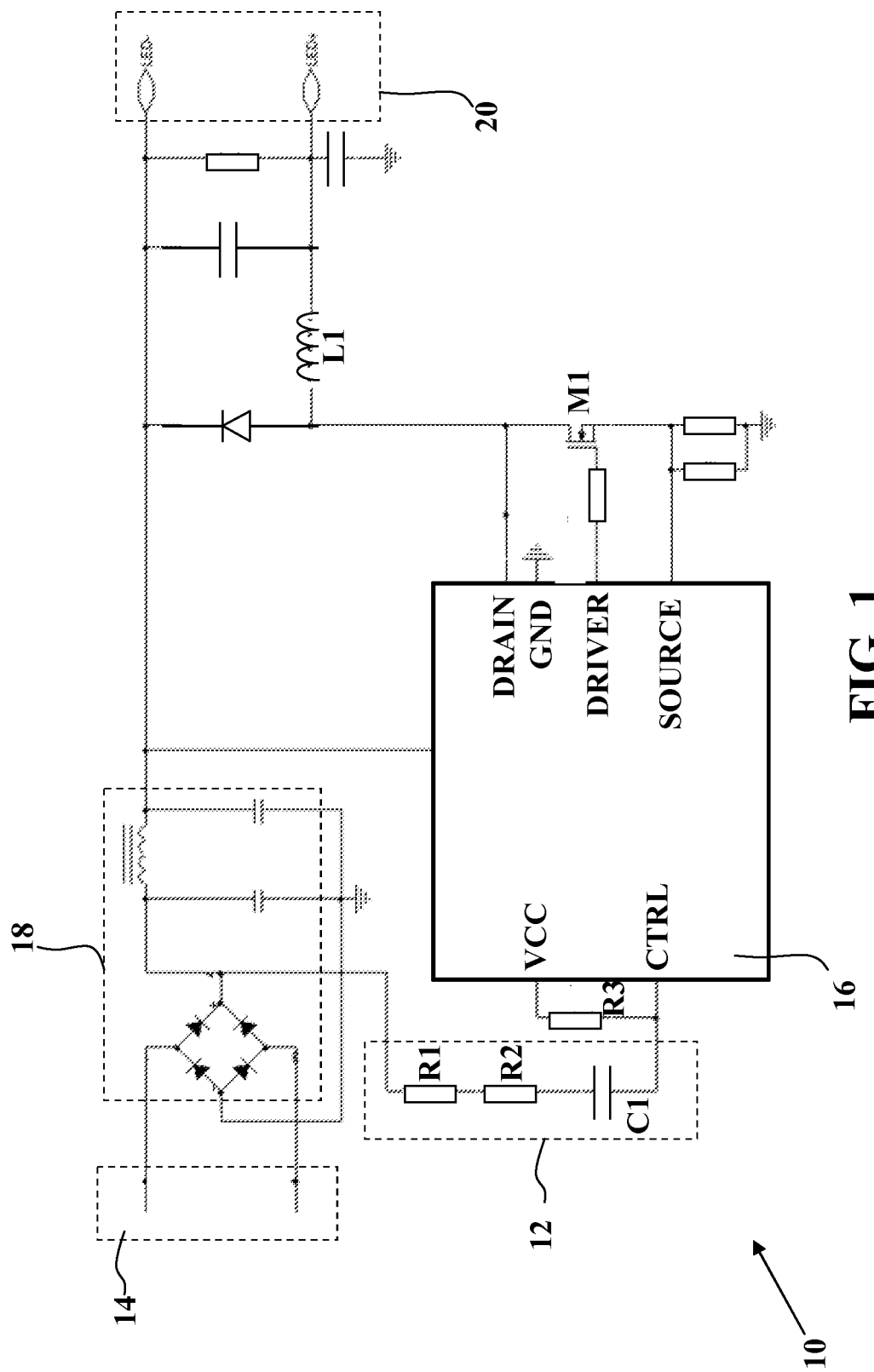
FIG. 1 is a schematic circuit diagram of an AC/DC converter circuit according to an embodiment of the invention.

Referring to FIG. 1 there is shown an AC/DC converter circuit 10 according to an embodiment of the invention. The circuit 10 comprises an AC coupling network 12 connected between an input terminal 14 and an integrated buck converter circuit 16.

The input terminal 14 is adapted to receive an AC supply voltage, such as a mains voltage supply, and to pass the received AC supply voltage to a bridge rectifier 18 which outputs a rectified version of the received AC supply voltage.

The integrated buck converter circuit 16 is adapted to control a switch Q1 to repeatedly ramps up the current in an inductor L1 to a pre-defined value and then release the stored energy of the inductor L1 into a load connected to the output terminal 20 of the circuit 10. In this way, integrated buck converter circuit 16 is adapted to supply (and control) a DC output current of the circuit 10. A signal applied to the control terminal CTRL of the integrated buck converter circuit 16 controls the operation of the integrated buck converter circuit 16. Thus, by adjusting the signal applied to the control terminal CTRL, operation of the integrated buck converter circuit 16 can be altered so as to modify the DC input and/or output current of the circuit 10.

The AC coupling network 12 is adapted to derive a signal from the output of the rectifier 18 (i.e. from the rectified AC supply voltage received by the input terminal) and to supply the derived signal to the control terminal CTRL of the integrated buck converter circuit 16.

In electronics, AC coupling is also known as capacitive coupling and is the transfer of energy within an electrical network by means of the capacitance between circuit nodes. AC or capacitive coupling is achieved by placing a capacitor in series with the signal to be coupled.

Here, the AC coupling network 12 comprises first R1 and second R2 resistors connected in series with a first capacitor C1. The first capacitor C1 is a coupling capacitor that connects two circuits such that only the AC signal from the first circuit (e.g. the rectifier 18) can pass through to the next while DC is blocked.

Also, a third resistor is connected between the control terminal CTRL and the voltage input terminal VCC of the integrated buck converter circuit 16.

The first R1, second R2 and third R3 resistors serve to scale the rectified AC signal from the rectifier 18 to the predetermined amplitude for the control terminal CTRL and the voltage input terminal VCC of the integrated buck converter circuit 16.

Thus, the signal provided to the control terminal CTRL of the integrated buck converter circuit 16 (which controls the operation of the integrated buck converter circuit 16) is derived from the rectified AC supply voltage. One or more of the control parameters of the integrated buck converter circuit 16 is therefore modulated with the phase of the AC supply voltage so as to improve the PF of the circuit 10 whilst maintaining regulation of the DC output current.

The modulated control parameter of the integrated buck converter circuit 16 can be, for example, the inductor L1 peak current (Ipk), the switching frequency (Fsw), or the interval between switching cycles or any combination thereof.

Figure 2A:
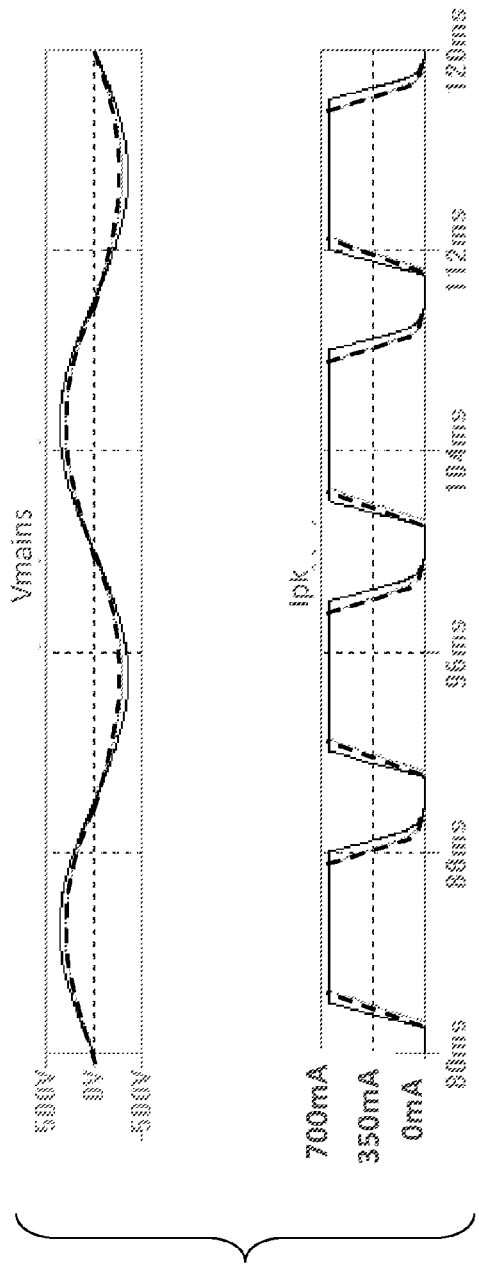
FIGS. 2A and 2B illustrate the simulated waveforms for a conventional AC/DC converter circuit and the circuit of FIG. 1, respectively, for two different magnitudes of AC supply voltage, wherein the second magnitude of the AC supply voltage is approximately 20% lower that than the first magnitude.
Figure 2B:
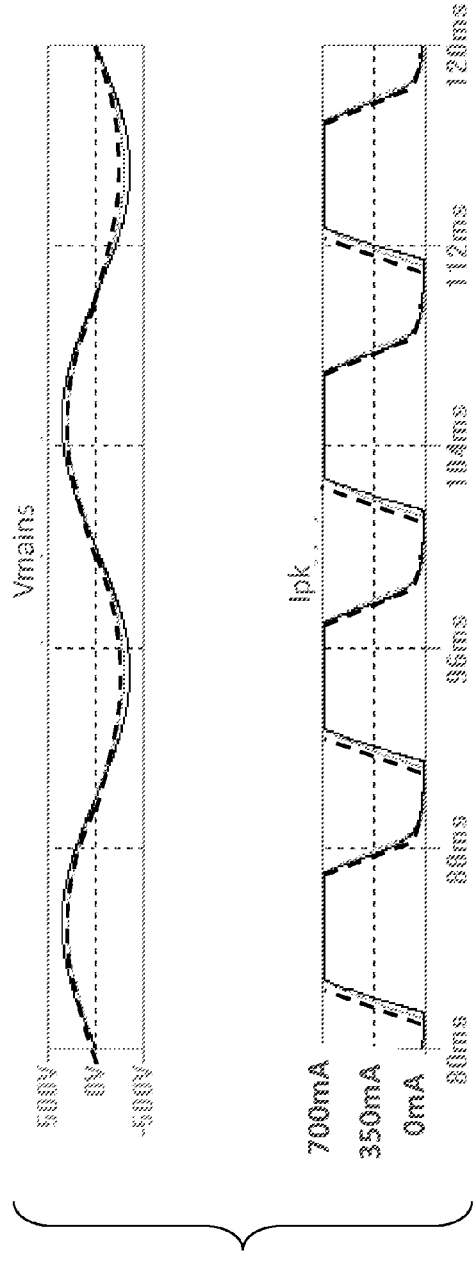

The AC coupling arrangement makes it possible to make the modulation almost independent of the magnitude of the AC supply voltage, such that good regulation of the output current is preserved. To demonstrate this, FIGS. 2A and 2B illustrate simulated waveforms for a conventional AC/DC converter circuit and the circuit of FIG. 1, respectively, for two magnitudes of the AC supply voltage (Vmains). The solid waveforms are for the AC supply voltage (Vmains) having a first magnitude, and the dashed waveforms are for the AC supply voltage (Vmains) having a second magnitude which is 20% lower that than the first magnitude.

It is clearly demonstrated in FIGS. 2A and 2B that the differences in the peak inductor current (Ipk) waveforms for the two magnitudes of the AC supply voltage (Vmains) are much smaller for the circuit of FIG. 1 (i.e. an AC/DC converter circuit according to an embodiment of the invention). In other words, variation of the peak inductor current (Ipk) waveform caused by variation of the AC supply voltage (Vmains) is greatly reduced in the circuit of FIG. 1. Accordingly, the circuit of FIG. 1 provides a more constant output current for different magnitudes of the supply voltage than that of the conventional AC/DC converter circuit.

Figure 3:
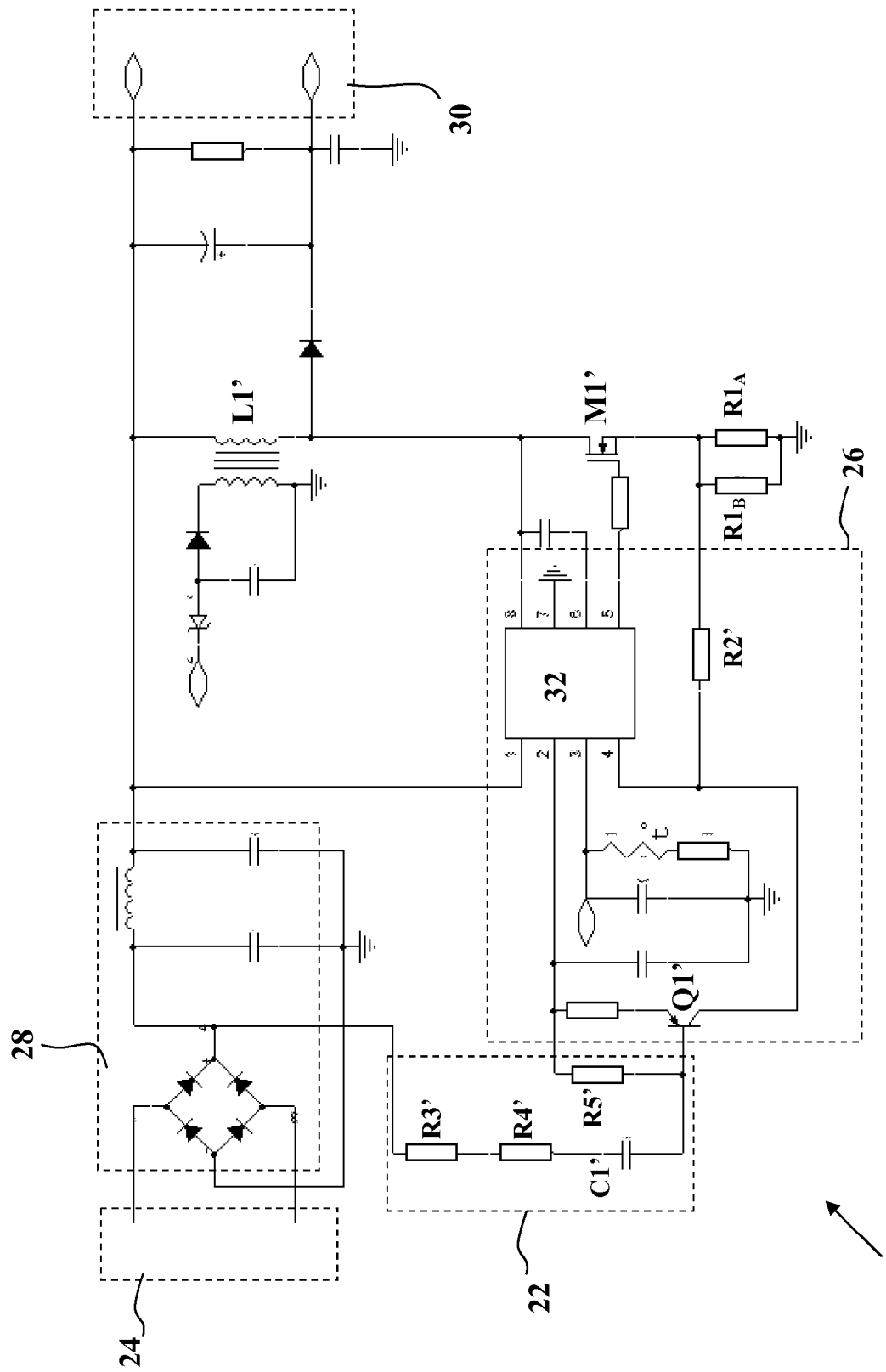
FIG. 3 is a schematic circuit diagram of an AC/DC converter circuit according to another embodiment of the invention.

Referring to FIG. 3 there is shown an AC/DC converter circuit 21 according to another embodiment of the invention. The circuit 21 comprises an AC coupling network 22 connected between an input terminal 24 and a driver circuit 26 of a buck-boost converter.

The input terminal 24 is adapted to receive an AC supply voltage, such as a mains voltage supply, and to pass the received AC supply voltage to a rectifier circuit arrangement 28 which outputs a rectified version of the received AC supply voltage.

The driver circuit 26 is adapted to control a switch M1' to repeatedly ramp up the current in an inductor L1' to a predefined value and then release the stored energy of the inductor L1' into a load connected to the output terminal 30 of the circuit 21. In this way, the circuit 21 is adapted to supply (and control) a DC output current of the circuit 21.

The driver circuit 26 comprises a SSL2109 driver IC 32 which is a conventional Buck or Buck-Boost driver IC operating in BCM. The inductor peak current is being sensed across $R1_A$ and $R1_B$. First transistor Q1' is connected between the second (VCC) pin and the $4^{th}$ ("Source") pin of the driver IC and can supply additional current though series resistor R2' such that the effective maximum peak current is changed.

The rectified AC supply voltage (i.e. the output signal from the rectifier circuit arrangement 28) is sensed using the AC-coupling network 22. Here, the AC coupling network comprises third R3', fourth R4', and fifth R5' resistors and a first capacitor C1' connected in series between the rectifier circuit arrangement 28 and the second (VCC) pin of the driver IC 32. The base of the first transistor is connected between the first capacitor C1' and the fifth resistor R5'.

A voltage comparator is connected on the 4th ("Source") pin of the driver IC 32 to detect that the maximum peak current has been reached.

According to the signal supplied to the base of the first transistor Q1' from the AC coupling network 22, the peak current is modulated by first transistor Q1'. Hence, the AC coupling network 22 derives a control signal from the AC supply voltage, and the control signal is used to control the driver IC 32 via the first transistor Q1'.

During the peaks of the AC supply voltage, the first transistor Q1' is off (i.e. does not conduct). For a period of about 4 ms around the zero-crossings of the AC supply voltage, the first transistor Q1' is on (i.e. will conduct) and so decreases the converter peak current. Thus, control of the driver IC 32 is modulated with the phase of the AC supply voltage so as to improve the PF of the circuit 21 whilst maintaining regulation of the DC output current.

Figure 4:
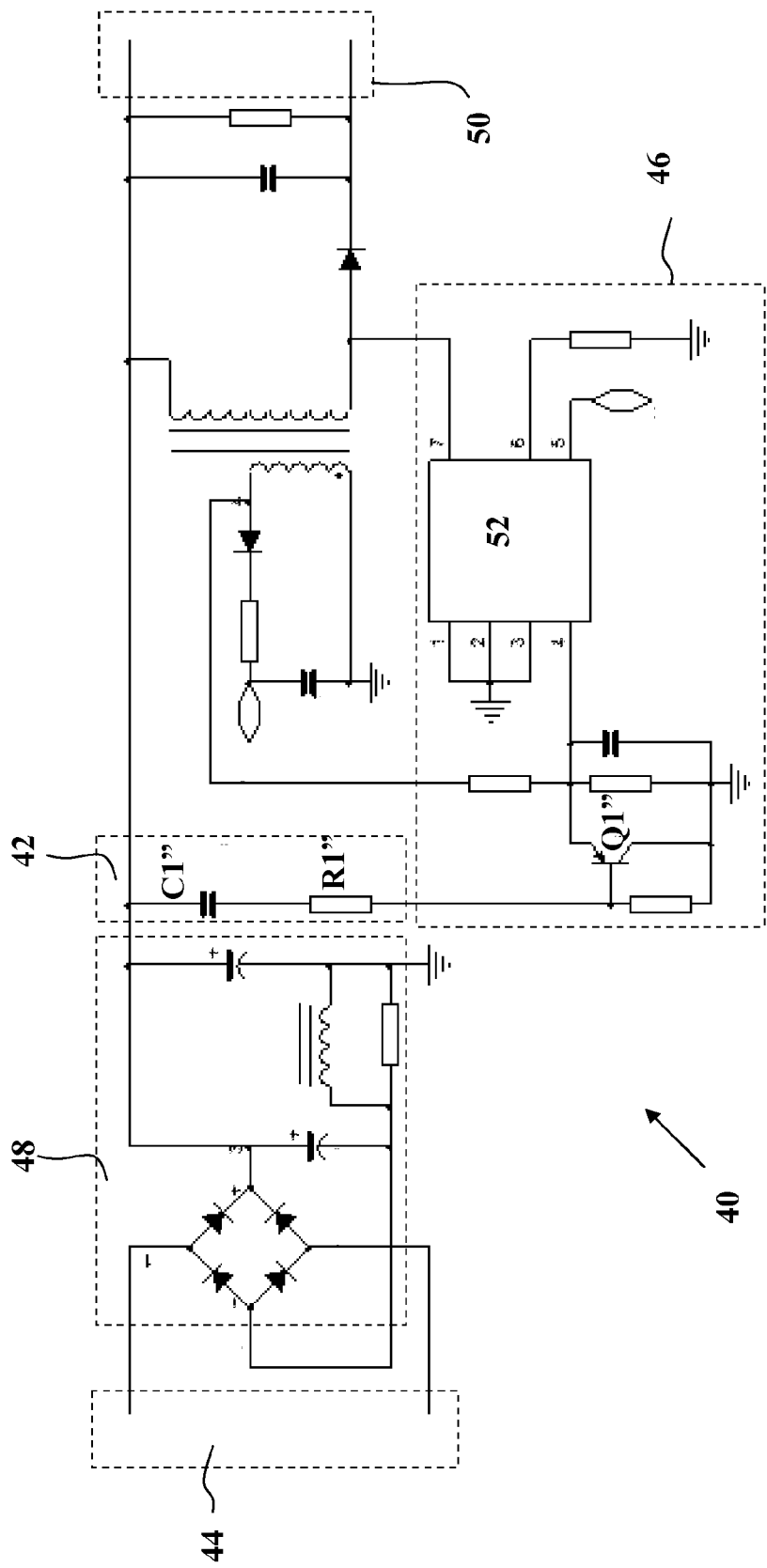
FIG. 4 is a schematic circuit diagram of an AC/DC converter circuit according to yet another embodiment of the invention.

Referring to FIG. 4 there is shown an AC/DC converter circuit 40 according to yet another embodiment of the invention. The circuit 40 comprises an AC coupling network 42 connected between an AC supply voltage input terminal 44 and a driver circuit 46 of a Buck-Boost converter.

The input terminal 44 is adapted to receive a mains AC voltage supply, and to pass the received mains AC voltage to a rectifier circuit arrangement 48 which outputs a rectified version of the received mains AC voltage.

The driver circuit 46 is adapted to supply (and control) a DC output current of the circuit 40. Here, the driver circuit 46 comprises a SSL21151 driver IC 52 which is a conventional Flyback/Buck-Boost converter driver IC operating in DCM. By modulating the fourth ("Sense") pin, the converter switching frequency can be reduced.

First transistor Q1" is connected between the fourth ('Sense') pin of the driver IC and ground.

The rectified mains AC voltage (i.e. the output signal from the rectifier circuit arrangement 48) is sensed using the AC-coupling network 42. Here, the AC coupling network 42 comprises a first resistor R1" and a first capacitor C1" connected in series between the rectifier circuit arrangement 48 and the base of the first transistor Q1".

The fourth ("Sense") pin is also connected to a voltage divider and transformer to sense the voltage across the LED and maintain stable output current independently of the LED output voltage.

According to the signal supplied to the base of the first transistor Q1" from the AC coupling network 42, the converter frequency is modulated by first transistor Q1". In other words, the AC coupling network 42 derives a control signal from the mains AC voltage, and the control signal is used to control the frequency of the driver IC 52 via the first transistor Q1".

During the peaks of the mains AC voltage, the first transistor Q1" is off (i.e. does not conduct). For a brief time period around the zero-crossings of the mains AC voltage, the first transistor Q1" is on (i.e. will conduct). Thus, frequency of the driver IC 52 is modulated with the phase of the mains AC voltage.

Although, the embodiments described above have been detailed in conjunction with specific driver ICs, other embodiments of the invention can be implements with other driver ICs for supplying a current to a load (such as an LED for example). Also, although embodiments have been described as being suitable for driving a SSL device, other embodiments are applicable as any mains-supplied AC/DC converter.

Embodiments need not be connected to a main AS supply voltage, but may instead be connected to any other suitable power supply.

The AC coupling network may be modified to optimize the circuit in a preferred direction by shifting the DC set-point and changing the gain. The AC coupling network can also be modified to contain a combination of AC and DC coupling.

Although embodiments enable modulation of the driver IC input in order to improve the converter PF, other objectives may also be served (like optimizing a compromise between the size of a required output capacitor and the PF).

Various modifications will be apparent to those skilled in the art.

The invention claimed is:

1. An AC/DC converter circuit comprising:
    an input terminal for receiving an AC supply voltage;
    a driver circuit adapted to supply a DC drive current or voltage to an output of the circuit based on a signal provided to a control terminal of the driver circuit; and
    an AC coupling network connected between the input terminal and the control terminal of the driver circuit,
    wherein the AC coupling network is adapted to derive a signal from an AC supply voltage received by the input terminal and to supply the derived signal to the control terminal of the driver circuit, and wherein the control terminal of the driver circuit is adapted to control at least one of: a peak inductor current; a switching frequency of the driver circuit; and a pulse interval, wherein the driver circuit comprises a driver integrated circuit and a switch circuit connected between two pins of the driver integrated circuit, and wherein the switch circuit is configured to modulate the peak inductor current and the switching frequency of the driver circuit based on a signal supplied to a base terminal of the switch circuit.

2. The circuit of claim 1, wherein the AC coupling network is adapted to derive a signal based on the phase of the AC supply voltage received by the input terminal.

3. The circuit of claim 1, wherein the driver circuit is an integrated circuit.

4. The circuit of claim 3, wherein the integrated circuit is an AC/DC converter driver.

5. The circuit of claim 1, further comprising a rectifier adapted to rectify an AC supply voltage received by the input terminal.

6. The circuit of claim 1, wherein the AC coupling network comprises a capacitor and resistor connected in series.

7. The circuit of claim 1, further comprising a DC coupling arrangement, and wherein the driver circuit is further adapted to supply the DC drive current or voltage to the output of the circuit based on a signal from the DC coupling arrangement.

8. A solid state lighting device comprising an AC/DC converter circuit according to claim 1.

9. An electrical power supply comprising an AC/DC converter circuit according to claim 1.

10. The AC/DC converter circuit of claim 1, wherein the AC coupling network comprises a first resistor, a capacitor connected in series with the first resistor, and a second resistor connected in parallel with the first resistor and the capacitor, and wherein the second resistor is connected to the base terminal of the switch circuit and to one of the two pins of the driver integrated circuit.

* * * * *